US011836388B2

(12) United States Patent
Nirmale et al.

(10) Patent No.: US 11,836,388 B2
(45) Date of Patent: Dec. 5, 2023

(54) INTELLIGENT METADATA COMPRESSION

(71) Applicant: EMC IP Holding Company LLC, Hopkinton, MA (US)

(72) Inventors: Sandeep Nirmale, Santa Clara, CA (US); Ramprasad Chinthekindi, San Jose, CA (US); Gobikrishnan Sundharraj, Santa Clara, CA (US); Rahul Goyal, Indore (IN)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 45 days.

(21) Appl. No.: 17/236,398

(22) Filed: Apr. 21, 2021

(65) Prior Publication Data
US 2022/0342610 A1 Oct. 27, 2022

(51) Int. Cl.
*G06F 3/06* (2006.01)
*H03M 7/30* (2006.01)

(52) U.S. Cl.
CPC ............ *G06F 3/0661* (2013.01); *G06F 3/067* (2013.01); *G06F 3/0608* (2013.01); *G06F 3/0641* (2013.01); *G06F 3/0652* (2013.01); *H03M 7/30* (2013.01)

(58) Field of Classification Search
CPC .... G06F 3/0661; G06F 3/0608; G06F 3/0641; G06F 3/0652; G06F 3/067; H03M 7/30
See application file for complete search history.

(56) References Cited

U.S. PATENT DOCUMENTS

| | | | | |
|---|---|---|---|---|
| 9,141,633 B1* | 9/2015 | Li | ........................... | G06F 16/113 |
| 9,436,723 B2* | 9/2016 | Lumb | ................... | G06F 3/0683 |
| 11,307,937 B1* | 4/2022 | Cheng | ................. | G06F 11/1469 |
| 11,451,839 B1* | 9/2022 | Giriyappa | ............... | G06F 16/93 |
| 2002/0101932 A1* | 8/2002 | Montgomery | .......... | H03M 7/30 375/240.25 |
| 2004/0098495 A1* | 5/2004 | Warren | ................... | H04L 69/04 709/230 |
| 2006/0294144 A1* | 12/2006 | Shin | ....................... | G06F 3/1232 |
| 2008/0170626 A1* | 7/2008 | Sung | ....................... | H04N 19/12 375/E7.145 |
| 2009/0190760 A1* | 7/2009 | Bojinov | ................ | G06F 3/0676 380/269 |
| 2012/0173773 A1* | 7/2012 | Povaliaev | ............. | G06F 3/0659 710/39 |

(Continued)

*Primary Examiner* — Tracy C Chan
(74) *Attorney, Agent, or Firm* — WOMBLE BOND DICKINSON (US) LLP

(57) ABSTRACT

Data segments and metadata segments to be stored in a storage system, where the data segments are deduplicated segments and each of the metadata segments includes a fingerprint for the corresponding data segment, for each of the metadata segments. It is determined that the metadata segment contains one or markers inserted by a client device of the storage system. The metadata segment is examined to determine whether the metadata segment satisfies a predetermined condition. In response to determining that the metadata satisfies the predetermined condition, the metadata segment is compressed using a predetermined compression algorithm. The compressed metadata segment is stored in the storage system, otherwise the metadata segment is stored in the storage system without compression. Thereafter, the data segments are stored in the storage system.

20 Claims, 6 Drawing Sheets

(56) References Cited

U.S. PATENT DOCUMENTS

| | | | |
|---|---|---|---|
| 2015/0106946 A1* | 4/2015 | Soman | G06F 21/6245 |
| | | | 726/26 |
| 2017/0161348 A1* | 6/2017 | Araki | G06F 16/951 |
| 2018/0101542 A1* | 4/2018 | Zhao | G06F 3/0608 |
| 2020/0105021 A1* | 4/2020 | Sohre | G06T 1/60 |
| 2021/0281664 A1* | 9/2021 | Suryanarayanarao | |
| | | | H04M 15/66 |
| 2022/0295345 A1* | 9/2022 | Trim | H04W 80/02 |

* cited by examiner

INTELLIGENT METADATA COMPRESSION

FIELD OF THE INVENTION

Embodiments of the present invention relate generally to data storage systems. More particularly, embodiments of the invention relate to intelligently compressing metadata associated with data storage and other similar systems.

BACKGROUND

At least one currently available data storage system includes data storage technology that can, among others, assist with protecting data using, among others, data redundancy. For example, a data storage system can create and store one or more backups that include actual data, metadata, or a combination that can, for example, be used at a later period of time.

Many data storage systems use data deduplication technology, snapshot or snapshot based technology, another suitable data storage technology, or any combination thereof to improve the storage utilization of data stored in or on the data storage systems (e.g., actual data, metadata, backup data, etc.). As demand for data storage systems increase, data storage technology is facing increasing pressures to optimize storage utilization in data storage systems.

When the data workload contains smaller sized dense markers, then the size of the metadata required is 2 to 3 times higher than average. This high metadata usage becomes a problem on metadata storage. In some cases, it is even worse because metadata is stored on expensive solid state device (SSD) based block storage and clients bear the cost of it.

Inline markers are smaller markers with a size fewer than 200 bytes. The file system stores inline markers in the metadata (e.g., inside L1 segment, which will be described in details further below) itself, unlike larger (embedded) markers which are stored as data (L0) segments. Metadata (L1) segment size is higher than the average 16K when markers are present in it. When markers are dense (frequency is high), then L1 size can go 2× to 3× times the average resulting in much higher metadata size requirement. This high metadata usage seems to amplify even more with a high deduplication ratio. FIG. 6 shows the metadata segment with and without the marker. Such metadata requires more storage space. The techniques of deduplication will be described in details further below.

BRIEF DESCRIPTION OF THE DRAWINGS

Embodiments described herein are illustrated by way of example and not limitation in the figures of the accompanying drawings in which like references indicate similar elements.

DETAILED DESCRIPTION

Figure 1:
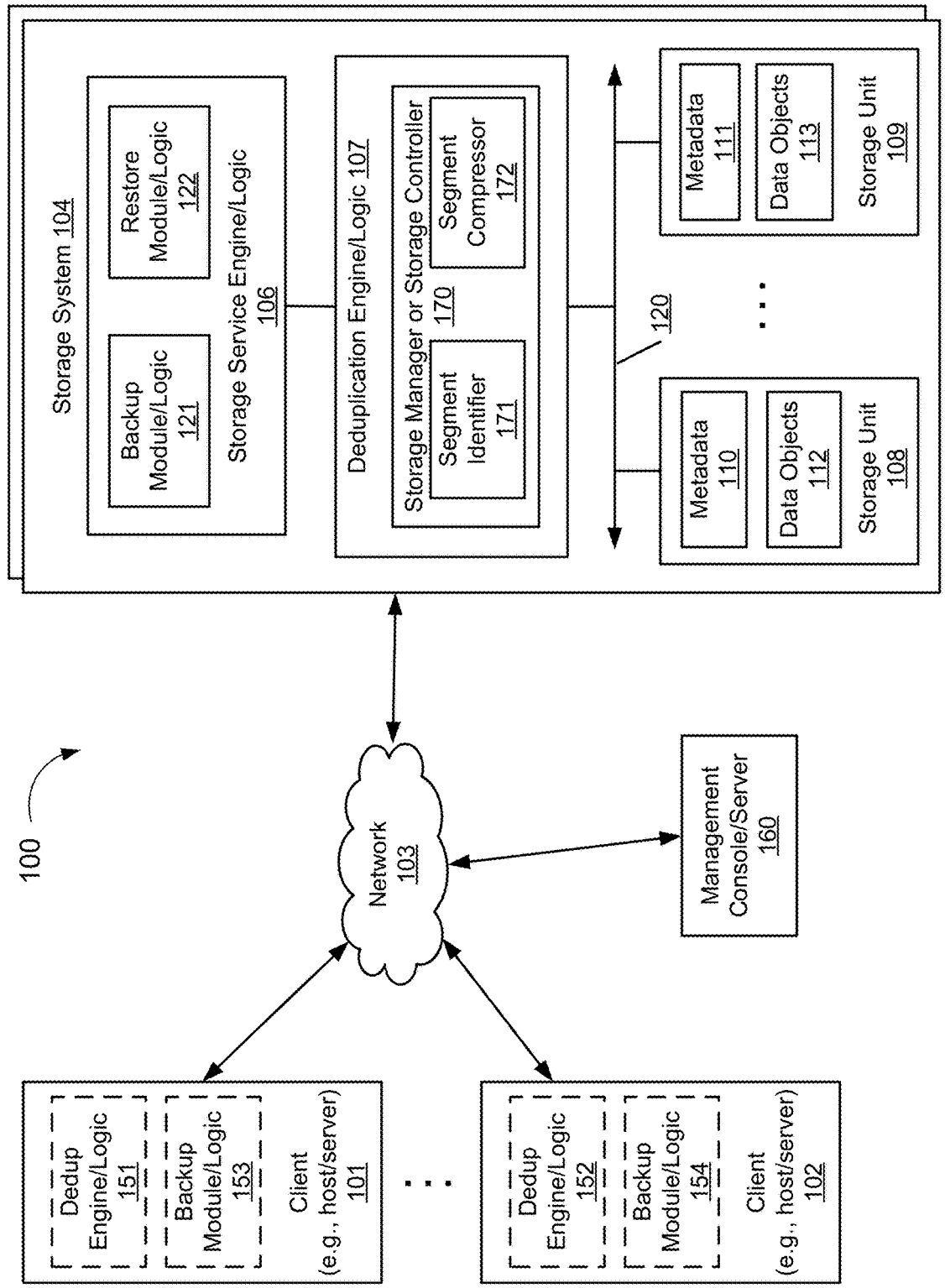
FIG. 1 is a block diagram illustrating a data storage system architecture according to one or more embodiments described herein.

Various embodiments and aspects will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment," "an embodiment," or their variations means that a particular feature, structure, or characteristic described in conjunction with the embodiment can be included in at least one embodiment. The appearances of the phrase "in one embodiment," "in an embodiment," or their variations in various places in the specification do not necessarily all refer to the same embodiment.

Embodiments described herein are directed to intelligent compression of metadata in data storage and other similar systems. Even though one or more of the embodiments described herein are explicitly described herein as being directed to a data storage system that includes or employs data deduplication technology, it is to be appreciated that one or more of the embodiments described herein can be used in or employed by any kind of data storage system, such as a data storage system that employs snapshot or snapshot based technology, a data storage system that employs data deduplication technology, any other suitable data storage system, or any combination thereof. One or more advantages and benefits of the embodiments will be evident from the description provided herein, the claims, the figures, or any combination thereof.

At least one currently available data storage system includes data storage technology that can, among others, assist with protecting data using, among others, data redundancy. For example, a data storage system can create and store one or more backups that include data or metadata for use at a later period of time. The data that is backed up can include, for example, actual data (e.g., user data, etc.). The metadata that is backed up can include, for example, metadata that is attached to or associated with actual data. As used herein, the term "data" and its variations include data, metadata, any other suitable form of information, or any combination thereof. Furthermore, and as used herein, the term "backup data," "backup of data," "backup," and their variations refer to one or more copies of data.

At least one currently available data storage system includes a backup client and a backup storage appliance (also simply referred to as a storage appliance or storage system). The backup client—which can be in the form of software, hardware, or a combination thereof—is, among others, responsible for creating (e.g., generating, etc.) one or more backups of data (e.g., user data, any other suitable data, any combination thereof, etc.). The backup(s) can be provided to the storage appliance. The backup storage appliance is, among others, responsible for managing and directing the storage of data, including, for example, the backup(s) created by the backup client.

In some scenarios, the creation of a backup by the backup client includes the backup client including (e.g., inserting, embedding, appending, etc.) additional data or metadata into the created backup. The additional data or metadata is not part of the original data that is backed up. Instead, the additional data or metadata is included as part of the created backup together with the actual backup of the original data. Consequently, a backup created by the backup client can be larger than the original data itself due to the additional data or metadata included the backup created by the backup client.

In at least one scenario, the storage appliance may implement data storage technology (e.g., deduplication technology, snapshot technology, any other suitable data storage technology, any combination thereof, etc.) to improve storage utilization of a backup received from the backup client. This implementation can, for example, include the storage appliance performing one or more data compression techniques on some or all of the received backup. Storing compressed data, as opposed to uncompressed data, can be beneficial to improving storage utilization, especially in data storage systems that use non-volatile storage technology (e.g., solid state storage (SSD) technology, etc.) for data storage. However, data compression of the backup created by the backup client by the storage appliance may have some shortcomings.

At least one shortcoming relates to a scenario in which the storage appliance indiscriminately performs one or more data compression techniques on all of the metadata in the backup created by the backup client. At least one instance of the indiscriminate performance described above is attributable, at least in part, to varying compressibility of metadata in the backup created by the backup client. A compressibility of metadata refers to or includes a likelihood of successful compression of a specific type of metadata when the specific type of metadata is subjected to one or more data compression techniques. Information about the varying compressibility of metadata in a backup created by a backup client can, for example, help distinguish between some of the metadata in the backup that may be more compressible than other metadata in the backup. Metadata that may be suitable for data compression includes, for example, metadata including marker data. On the other hand, metadata that may be unsuitable for data compression includes, for example, metadata comprising data associated with a cryptographic hash function, such as Secure Hash Algorithm 1 (SHA-1).

In one or more scenarios that are similar or identical to the one described above, information characterizing the varying compressibility of metadata in a backup created by a backup client may not be available to the backup client, the storage appliance, any other component in the data storage system, or any other combination thereof. Without this information, the storage appliance views all the metadata in the backup as suitable for compression. As a result, the storage appliance indiscriminately applies one or more data compression techniques to all of the metadata in the backup, including metadata in the backup that may not be suitable for compression. Consequently, the indiscriminate application described above can, among others, result in inefficient resource utilization by the storage appliance, which can in turn assist with suboptimal operation of the storage appliance, one or more other components of the data storage system, or the entire data storage system itself. These and other shortcomings may contribute to hindering the development of data storage technology that is more optimized than at least one currently available data storage technology.

As alluded to above, embodiments described herein are directed to intelligent compression of metadata in data storage and other similar systems. One or more of the embodiments described herein can assist with minimizing or eliminating one or more of the shortcomings described above. At least one of the embodiments described herein is directed to a technique of intelligently compressing metadata that is based on or implemented using a machine (e.g., at least one processor, at least one computer, any combination thereof, etc.), a non-transitory computer readable medium comprising machine-executable instructions, at least one type of circuitry (e.g., communication circuitry, processing circuitry, etc.), software, hardware, or any combination thereof.

In one or more embodiments, a technique of intelligently compressing metadata includes receiving data comprising metadata in a data storage system. The data storage system can include or be based on deduplication technology, snapshot or snapshot based technology, any other suitable data storage technology, or any combination thereof. One or more components of the data storage system can receive the data described above. The component(s) can be based on or implemented using hardware, software, any other suitable implementation technology, or any combination thereof, Examples of the component(s) include, but are not limited to, a data storage engine/logic, a deduplication engine/logic, a storage manager or storage controller, a segmenter or content store, a duplicate eliminator or segment store, a segment identifier, a segment compressor, or any combination thereof.

In one embodiment, data segments and metadata segments are received to be stored in a storage system, where the data segments are deduplicated segments and each of the metadata segments includes a fingerprint for the corresponding data segment, for each of the metadata segments. It is determined that the metadata segment contains one or more markers inserted by a client device of the storage system. The metadata segment is examined to determine whether the metadata segment satisfies a predetermined condition. In response to determining that the metadata satisfies the predetermined condition, the metadata segment is compressed using a predetermined compression algorithm. The compressed metadata segment is stored in the storage system, otherwise the metadata segment is stored in the storage system without compression. Thereafter, the data segments are stored in the storage system.

In one embodiment, a metadata segment satisfies the predetermined condition if a size of the metadata segment exceeds a predetermined size threshold. Alternatively, a metadata segment satisfies the predetermined condition if a system parameter of the storage system has been set to a predetermined configuration state. Further, a metadata segment satisfies the predetermined condition if a number of markers contained in the metadata segment exceeds a predetermined marker threshold. The metadata segment satisfies the predetermined condition if a compression ratio for a metadata segment having a similar number of markers is above a predetermined compression threshold based on a histogram of prior metadata segment compressions. Further, a metadata segment satisfies the predetermined condition if available processing resources of the storage system for data compression are above a predetermined resource threshold. Further, a metadata segment satisfies the predetermined condition if an available storage space of the storage system is above predetermined storage threshold.

The data segments and the metadata segments are received from the client device as a part of a backup operation from the client device to the storage system. Alternatively, the data segments and the metadata segments are identified by a garbage collection process periodically performed on existing data segments and metadata segments previously stored in the storage system.

FIG. 1 is a block diagram illustrating a data storage system architecture 100 according to one or more embodiments described herein. Referring to FIG. 1, the data storage system architecture 100 includes, but is not limited to, one or more client systems 101-102 communicatively coupled to a storage system 104 over a network 103. The clients 101-102 may be based on or include any type of client, such as a host, a server, a personal computer (e.g., desktops, laptops, and tablets), a "thin" client, a personal digital assistant (PDA), a Web enabled appliance, or a mobile phone (e.g., Smartphone), etc. Alternatively, or additionally, one or both of the clients 101-102 may be a primary storage system (e.g., local data center) that provides storage to other local clients, which may periodically back up the content stored therein to a backup storage system (e.g., a disaster recovery site or system), such as the storage system 104. The network 103 may be or include any type of network, such as a local area network (LAN), a wide area network (WAN) such as the Internet, a fiber network, a storage network, or a combination thereof, wired or wireless. The clients 101-102 may be in physical proximity or may be physically remote from one another. The storage system 104 may be located in proximity to one, both, or none of the clients 101-102.

The storage system 104 may include or represent any type of servers or a cluster of one or more servers (e.g., cloud servers). For example, the storage system 104 may be a storage server used for various different purposes, such as to provide multiple users or client systems with access to shared data and/or to back up (or restore) data (e.g., mission critical data). The storage system 104 may provide storage services to clients or users via a variety of access interfaces and/or protocols such as file-based access protocols and block-based access protocols. The file-based access protocols may include the network file system (NFS) protocol, common Internet file system (CIFS) protocol, and direct access file system protocol, etc. The block-based access protocols may include the small computer system interface (SCSI) protocols, Internet SCSI or iSCSI, and Fibre channel (FC) protocol, etc. The storage system 104 may further provide storage services via an object-based protocol and Hadoop distributed file system (HDFS) protocol.

In one embodiment, the storage system 104 includes, but is not limited to, a storage service engine 106 (also referred to as service logic, service module, or service unit, which may be implemented in software, hardware, or a combination thereof), a deduplication engine/logic 107, and one or more storage units or devices 108-109 communicatively coupled to each other. In one embodiment, and as shown in FIG. 1, the deduplication engine/logic 107 includes a storage manager or storage controller 170. In one embodiment, and as shown in FIG. 1, the storage manager or storage controller 170 includes a segment identifier 171, a segment compressor 172, or any combination thereof. Each of these components is described in further detail below.

The storage service engine 106 may represent any storage service related components configured or adapted to provide storage services (e.g., storage as a service) to one or more clients (e.g., a variety of clients, the client 101, the client 102, any combination thereof, etc.) using any access protocol (e.g., one or more of the access protocols set forth above, any other suitable access protocol, any combination thereof, etc.). For example, the storage service engine 106 may include a backup module/logic 121 and a restore module/logic 122. The backup module/logic 121 can be configured to receive and back up data from a client (e.g., one or more of the clients 101-102) and to store the backup data in one or more of the storage units 108-109. The restore module/logic 122 is configured to retrieve and restore backup data from one or more of the storage units 108-109 back to at least one client (e.g., one or more of the clients 101-102).

At least one of the storage units 108-109 may be implemented locally (e.g., single node operating environment) or remotely (e.g., multi-node operating environment) via an interconnect 120, which may be a bus and/or a network (e.g., a storage network, a network similar to the network 103, any other suitable network, any combination thereof, etc.). One or more of the storage units 108-109 may include a single storage device such as a hard disk, a tape drive, a semiconductor memory, multiple storage devices such as a redundant array system (e.g., a redundant array of independent disks (RAID)), a system for storage such as a library system or network attached storage system, or any other appropriate storage device or system. At least one of the storage units 108-109 can be located locally or remotely accessible over a network (e.g., the network 103, any other suitable network, any combination thereof, etc.).

In response to a data file to be stored in at least one of the storage units 108-109, according to one or more embodiments, a deduplication engine/logic 107 is configured to segment the data file into multiple segments (also referred to as chunks) according to one or more of segmentation criteria, policies, rules, heuristics, or any combination thereof. The deduplication engine/logic 107 may choose not to store a segment in one or more of the storage units 108-109 if the segment has been previously stored in one or more of the storage units 108-109. In the event that deduplication engine/logic 107 chooses not to store the segment in one or more of the storage units 108-109, the deduplication engine/logic 107 stores metadata enabling the reconstruction of the data file using the previously stored segment. As a result, segments of data files are stored in a deduplicated manner within at least one of the storage units 108-109, across at least one of the storage units 108-109, or any combination thereof. Metadata, such as metadata 110-111, may be stored in at least one of the storage units 108-109, such that files can be accessed independent of any other storage unit or units. Metadata of each storage unit includes enough information to provide access to the files the storage unit contains.

Data deduplication is a process by which a data storage system can detect multiple identical copies of data and keep a single copy of that data, thus eliminating the redundant data by removing other copies of that data and thus improving storage utilization. In at least some systems, data deduplication requires iterating over set of data blocks in one or more storage extents, finding the blocks that contain identical information by processing digest information associated with each block and mapping the identical blocks to a single copy of the data. In such systems, an index table of unique digests is created to find commonality among the data set. When a deduplicated data block is updated with a new content, a new data block is created containing the new updated content. Mapping of the deduplicated block is then changed to point to the new data block and the deduplicated block no longer points to the single copy of the data. This process is referred to as reduplication.

Data deduplication can operate at a file or a block level. File deduplication eliminates duplicate files (as in the example above), but block deduplication processes blocks within a file and saves unique copy of each block. For example, if only a few bytes of a document or presentation or a file are changed, only the changed blocks are saved. The changes made to few bytes of the document or the presentation or the file do not constitute an entirely new file. The sharing of file system data blocks conserves data storage for storing files in a data storage system. The snapshot copy facility is a space saving technology that enables sharing of file system data blocks among versions of a file. On the other hand, a deduplication facility enables the sharing of file system data blocks within a file, among versions of a file, between versions of a file and unrelated files, and among unrelated files. Therefore, the deduplication facility eliminates from the data storage system any file system data blocks containing duplicative data content.

Deduplication of data happens in two logically distinct operations: detection and remapping. The detection operation identifies blocks containing the same data. The remapping operation updates address maps that record physical locations of logical units (LUNs) of data so that a single block of data is shared by multiple LUNs or by multiple positions within the same LUN. Detection is accomplished by building a database (e.g., index table) that maintains a digest (e.g., SHA, checksum) and, a deduplication key for each data block. When two data blocks have the same digest they have a sufficiently high probability of containing the same data to warrant a bit-for-bit comparison to confirm they are exact duplicates.

A goal of the deduplication engine/logic 107 is to maintain only a single copy of each unique set of data within a data set. To achieve that goal, the deduplication engine/logic 107 finds data blocks that have not been deduplicated and processes data blocks for deduplication by computing digests for data blocks. A digest is a representation of contents stored in a data block. Further, the digest is mathematically computed (e.g., MD5, SHA-1, SHA-2) in such a way that, computationally, there is a very low or zero probability of finding two data blocks that have the same digest but different contents. If the digest for the data block is sent together with the data block, a recipient of the data block can compute a new digest from the received data block and can compare the new digest with the received digest to determine whether the received data block is valid. Additionally, a digest is stored in an index table in order to process data blocks within the data set for deduplication. Further, a deduplication key identifying a data block is also stored in index table along with the digest for the data block.

A deduplication key uniquely identifies a data block by storing information (such as logical address, physical address) of the data block. The deduplication engine/logic 107 identifies data blocks that can potentially be deduplicated by comparing digests of data blocks with list of digests stored in the index table. Further, when data blocks are deduplicated after comparing digest information, the deduplication engine/logic 107 updates metadata of deduplicated data blocks. Additionally, the deduplication engine/logic 107 updates metadata of a data block when the data block is reduplicated.

In one or more embodiments, and referring back to FIG. 1, at least one of the clients 101-102 may further include an optional deduplication logic (e.g., a deduplication engine/logic 151, a deduplication engine/logic 152, etc.) having at least a portion of the functionalities of the deduplication engine/logic 107. In one embodiment, each deduplication engines/logic 151-152 is configured to perform local deduplication operations for the clients 101-102, respectively. For example, prior to transmitting data to the storage system 104, each deduplication engine/logic 151-152 may deduplicate the data into deduplicated segments and determine whether a particular deduplicated segment has already been stored in the storage system 104. A deduplicated segment is transmitted to the storage system 104 by one or more of the deduplication engines/logic 151-152 if the deduplicated segment has not been stored in the storage system 104.

For example, when the client 101 is about to transmit a data stream (e.g., a file, a directory of one or more files, any other suitable data, any combination thereof, etc.) to the storage system 104, the deduplication engine/logic 151 is configured to deduplicate the data stream into deduplicated segments. For each of the deduplicated segments, the client 101 transmits a fingerprint or representative of the deduplicated segment to the storage system 104 to determine whether that particular deduplicated segment has already been stored in the storage system 104. A deduplicated segment that has been stored in the storage system 104 may be previously received from the same client 101 or from another client, such as the client 102. In response to a response from the storage system 104 indicating that the segment has not been stored in the storage system 104, that particular segment is then transmitted over to the storage system 104. As a result, the network traffic or bandwidth and the processing resources required can be greatly reduced.

Referring again to FIG. 1, and in at least one embodiment, one or more of the clients 101-102 may further include an optional backup module (e.g., a backup module/logic 153 in the client 101, a backup module/logic 154 in the client 102, etc.) having at least a portion of the functionalities of the backup module/logic 121 of the storage system 104 that are described herein. One or more of the backup modules/logic 153-154 may be configured to receive and back up data stored in or accessible to one or more of the clients 101-102 and to store or cause storage of the backup data in one or more of the client 101, the client 102, the storage system 104, any other storage system, device, or technology that may be part of or associated with the data storage system architecture 100, or any combination thereof.

It is to be appreciated that the data storage system architecture 100 can include any number of clients—that is, less than, equal to, or more than the clients 101-102—and that at least some of the description provided herein with regard to any one of the clients 101-102 is also applicable to one or more of the other client(s) in the data storage system architecture 100. For example, and with specific regard to FIG. 1, at least some of the description provided herein with regard to one of the clients 101-102 is also applicable to the other one or both of the clients 101-102. For brevity, and to avoid obscuring the descriptions provided herein, some or all of the descriptions may sometimes focus on client 101 and not any other client (e.g., client 102, any other client in the data storage system architecture 100 that is not shown in FIG. 1, any combination thereof, etc.).

Referring again to FIG. 1, one or more components of or in the client 101 may process or be configured to process data stored in or accessible to client 101. More specifically, the backup module/logic 153, the deduplication engine/logic 151, another component of the client 101, or any combination thereof may process or be configured to process data stored in or accessible to the client 101. For example, processing of data stored in or accessible to the client 101 can be performed by the backup module/logic 153. Such processing may include the backup module/logic 153 generating a backup of the data stored in or accessible to the client 101. For a further example, the backup module/logic 153 includes (e.g., embeds, inserts, etc.) additional information (e.g., data, metadata, a combination thereof, etc.) in the backup during the generation of the backup. Due to the inclusion of the additional information in the backup by the backup module/logic 153, the created backup can sometimes be larger in size than the data that was backed up. The additional information may be generated by, for example, the backup module/logic 153, the deduplication engine/logic 151, another component of the client 101, or any combination thereof.

The additional information described above may comprise any type of data, metadata, or any combination thereof that is associated with the data stored in or accessible to the client 101, the processing (e.g., backing up, etc.) of such data, the backup module/logic 153, the deduplication engine/logic 151, the client 101 itself, or any combination thereof. An example of the additional information includes one or more markers. As used herein, the terms "marker," "markers," "marker data," "marker metadata," and their variations refer to first data (e.g., data, metadata, any combination thereof, etc.) that is included in second data (e.g., one or more backups, etc.) communicated to a storage system (e.g., the storage system 104, any other suitable storage system, any combination thereof, etc.) prior to the storage system receiving the second data. One notable characteristic of the first data is that the storage system does not generate or include the first data in the second data communicated to and received by the storage system. Instead, a component, device, system, or technology that is separate or distinct from the storage system may include the first data in the second data communicated to and received by the storage system. The first data may be generated by the component/device/system/technology described above or by another component/device/system/technology. Referring to the previous example described above that focused on the backup module/logic 153 generating a backup of data stored in or accessible to the client 101, the additional information that is included in the backup by the backup module/logic 153 comprises one or more markers. In this example, the backup module/logic 153, which is separate and distinct from the storage system 104, is responsible for including the additional information (e.g., the one or more markers, etc.) into the backup.

Markers may be included (e.g., inserted, embedded, etc.) in a data file due to or during one or more processing operations performed on the data file prior to a storage system receiving the data file. For example, a marker may be inserted in a data portion (e.g., body, payload, etc.) of a data file, a metadata portion (e.g., a header, a block header, etc.) of the data file, or any combination thereof. In at least one specific example, a marker is part of a data file's metadata (e.g., the metadata portion of the data file, etc.). Markers have many uses. For example, a marker may be included in a data file to denote a beginning or an end of the data file. For another example, a marker may be included in a data file to denote a beginning or an end of a specific data type in the data file (e.g., metadata, payload, etc.). A marker may also be used to define attributes of a data file having the marker, such as a length of the data file.

There are two main categories of markers that are distinguished from each other based, at least in part, on their sizes—inline markers and embedded markers. An inline marker has a size that is equal to or less than two hundred (200) bytes, while an embedded marker has a size that is greater than 200 bytes. As described in further detail below, one or more of the embodiments described herein utilizes at least one of the differences between inline and embedded markers to enable intelligent compression of metadata in a data storage system architecture (e.g., the architecture 100, etc.).

As alluded above, the storage system 104 can receive data comprising one or more markers from the client 101. One or more components of the storage system 104 can process the received data. For example, one or more of the storage service engine 106 and the deduplication engine/logic 107 may process the received data to detect the marker(s). Based on one or more rules or policies for or associated with handling markers, one or more of the storage service engine 106 and the deduplication engine/logic 107 can remove at least one of the detected marker(s) prior to deduplication of the received data by the deduplication engine/logic 107. Removing one or more of the marker(s) can assist with improving deduplication of the received data by reducing the likelihood of one or more of the storage service engine 106 and the deduplication engine/logic 107 improperly determining that some or all of the received data includes unique data. Failing to remove any of the marker(s) from the received data may increase the likelihood of one or more of the storage service engine 106 and the deduplication engine/logic 107 determining that some or all of the received data includes unique data, which can in turn lead to suboptimal deduplication of the received data.

In one embodiment, the deduplication engine/logic 107 includes a storage manager or storage controller 170 configured to manage storage or computing resources associated with the storage system 104, such as, for example, storage space and processing resources (e.g., processor, memory, network resources). The storage manager or storage controller 170 may be accessed by an administrator of management console or server 160 remotely via a management or configuration interface (not shown). The administrator can provision and manage storage resources based on a set of policies, rules, and/or service level agreements. The storage resources may be virtualized into a pool of virtual storage resources, where underlying physical storage resources represented by the corresponding virtual storage resources may be implemented locally, remotely (e.g., hosted by another storage system), or both. The virtual storage resources can be provisioned, allocated, and/or defined by an administrator or automatically by the storage manager based on a set of software-defined policies. The virtual storage resources may be represented in one or more virtual machines (e.g., virtual storage systems) managed by one or more virtual machine managers (VMMs). Each of the virtual machines can be provisioned to provide a particular type of storage services (e.g., file-based, block-based, object-based, or HDFS) to a client based on a storage policy or service level agreement associated with that particular client as part of software-defined storage services.

The storage manager or storage controller 170 can include, be based on, or implemented using, among others, one or more logic or modules. One or more of the logic/modules of the storage manager or storage controller 170 can be implemented using software, hardware, or any combination thereof. For example, one logic/module of the storage manager or storage controller 170 may be implemented using one or more processing devices or processors, circuitry, one or more computers executing machine readable instructions, any other suitable implementation, or any combination thereof.

In one embodiment, the one or more logic or modules of the storage manager or storage controller 170 include a segment identifier 171 that can assist with enabling one or more embodiments described herein that are directed to intelligently compressing metadata in a data storage system architecture, such as the architecture 100. For example, the segment identifier 171 can enable an informed identification of a subset of data from a set of data in a data storage or other similar system according to one or more embodiments described herein.

The segment identifier 171 can, in one embodiment, receive or be configured to receive data comprising metadata. Such data can, for example, include: (i) at least some of the metadata 110; (ii) at least some of the metadata 111; (iii) at least some of the data objects 112; (iv) at least some of the data objects 113; (v) some or all of the metadata from, accessible to, or associated with any other component of the data storage system architecture 100; (vi) some or all of the data from, accessible to, or associated with any other component of the data storage system architecture 100, and any combination thereof. In one embodiment, the segment identifier 171 receives some or all of the data comprising the metadata from the storage service engine 106, the deduplication engine/logic 107, the storage unit 108, the storage unit 109, or any combination thereof. Such data can, for example, include data received by the storage system 104 from one or more of the clients 101-102, as described above.

In one scenario, the data comprising the metadata that is received by the segment identifier 171 includes one or more markers. Markers are described in detail above. For brevity, markers will not be described again unless such description is necessary. The marker(s) may be included into the data received by the segment identifier 171, by one or more components of the client 101, one or more components of the client 102, one or more components of the storage service engine 106, deduplication engine/logic 107, storage unit 108, storage unit 109, or any combination thereof.

In one embodiment, the segment identifier 171 can abstract or be configured to abstract the received data comprising the metadata into or as a file tree having a plurality of segments or chunks in a plurality of levels that are organized in a hierarchy. In one example, the abstraction includes the segment identifier 171 causing or being configured to cause the deduplication engine/logic 107 to segment the received data comprising the metadata into multiple segments or chunks according to a variety of segmentation policies or rules. In one embodiment, the deduplication engine/logic 107 may segment some or all of the data comprising the marker(s) into multiple segments or chunks, which are abstracted by the segment identifier 171 as or into a file tree (e.g., a Merkle file tree, etc.) having the multiple segments or chunks organized in a hierarchy of multiple levels. The file tree can, in one example, have segments organized into seven (7) levels—Level 0 (L0) segments, Level 1 (L1) segments, Level 2 (L2) segments, Level 3 (L3) segments, Level 4 (L4) segments, Level 5 (L5) segments, and Level 6 (L6) segments. In the file tree, the L0 segments are the lowest level of segments and the L6 segments are the highest level of segments. The L0 segments includes segments that represent actual data (e.g., data objects, user data, payload, etc.), while the L1-L6 segments include segments that represent metadata (e.g., header, body header, tags, etc.). Additional details about the file tree described above are described below in connection with at least FIG. 2.

In one embodiment, the segment(s) representing inline marker data differ from the segment(s) representing embedded marker data. For example, the segment identifier 171 abstracts one or more segments representing inline marker data into L1 segment(s) of the file tree, while abstracting one or more segments representing embedded marker data into L0 segment(s) of the file tree. In addition to the L1 segment(s) representing the inline marker(s) and the L0 segments representing the embedded markers, the segment identifier 171 abstracts one or more L1 segments that represent fingerprint data associated with the L0 segment(s) representing the embedded markers in the file tree. As explained above, inline marker data is more compressible than embedded marker data. Consequently, and for one example, the L1 segment(s) representing the inline marker(s) can be suitable candidates for compression, while the L0 segment(s) representing the embedded marker(s) and the L1 segment(s) representing fingerprint data associated with the L0 segment(s) that represent the embedded marker(s) may not be suitable candidates for compression. As described in further detail below, one or more of the embodiments described herein utilizes at least one of the differences between L1 segment(s) representing the inline marker(s), L0 segment(s) representing the embedded marker(s), and L1 segment(s) representing fingerprint data associated with the L0 segment(s) that represent the embedded marker(s) to enable intelligent compression of metadata in a data storage system architecture (e.g., the architecture 100, etc.).

One embodiment further includes the segment identifier 171 determining that a segment from the multiple segments comprises one or more markers. The segment that is determined to include the marker(s) represents at least some of the received metadata. In one embodiment, the segment identifier 171 determines that the segment having the marker(s) therein is a candidate for compression. In one embodiment, the segment identifier 171 determines that the segment having the marker(s) therein is a candidate for compression based, at least in part, on the marker(s). For example, and in one embodiment, such a determination includes the segment identifier 171 detecting a presence of a marker in the segment having the marker(s) therein and determining that the segment is the candidate for compression based, at least in part, on the presence of the marker. For another example, and in one embodiment, such a determination includes the segment identifier 171 determining a size of one or more segments from the plurality of segments that represent metadata (e.g., the segment having the marker(s) therein, etc.) equals or exceeds a threshold size and determining that the segment having the marker(s) therein is the candidate for compression based, at least in part, on the size of the one or more segments equaling or exceeding the threshold size. For yet another example, and in one embodiment, such a determination includes the segment identifier 171 determining a number of markers in the segment having the marker(s) therein equals or exceeds a threshold number and determining that the segment having the marker(s) therein is the candidate for compression based, at least in part, on the number of markers equaling or exceeding the threshold number.

For one more example, and in one embodiment, such a determination includes the segment identifier 171 determining a first characterization of a first marker in the segment having the marker(s) therein is similar or equal to a second characterization of a second marker and determining that the segment having the marker(s) therein is the candidate for compression based, at least in part, on the first characterization of the first marker being similar or equal to the second characterization of the second marker. In one embodiment, the first characterization of the first marker contains an indication or identification of a type of the first marker and the second characterization of the second marker includes an indication or identification of a type of the second marker. Furthermore, the first characterization of the first marker is similar or equal to the second characterization of the second marker when the first indication is similar or identical to the second indication. In one embodiment, the determination of the similar or equal characterizations includes determining that the first marker from the marker(s) in the segment and the second marker have an identical or similar type. For example, the first and second markers are identical or similar inline markers, identical or similar embedded markers, etc. The second marker may or may not be part of the marker(s) in the segment having the marker(s) therein.

For an additional example, and in one embodiment, such a determination includes the segment identifier 171 analyzing the segment having the marker(s) therein or at least one of the marker(s) based, at least in part, on a heuristic. The segment having the marker(s) therein or at least one of the marker(s) can, in one embodiment, be processed using the heuristic. For example, the heuristic is applied to segment having the marker(s) therein or at least one of the marker(s). The heuristic can be, comprised, or be based on any suitable heuristic or combination of heuristics that is associated with data compression of previous candidates for compression (e.g., segments that represent data or metadata (e.g., the segment having the marker(s) therein, etc.), etc.). For example, the heuristic can include data characterizing a previous candidate for data compression, such as a segment that includes marker(s), at least one of the marker(s), or any combination thereof. Such data can include historical data, real-time data, near real-time data, any other suitable time-dependent data, or any combination thereof. Data that can be included in a suitable heuristic includes, but is not limited to, one or more of the following: (i) historical, real-time, near real-time data characterizing one or more segments having marker(s) therein that were deemed to be suitable or unsuitable candidates for compression; (ii) historical, real-time, near real-time data characterizing one or more markers that were deemed to be suitable or unsuitable candidates for compression; (iii) historical, real-time, near real-time data characterizing one or more segments having marker(s) therein that were successfully or unsuccessfully compressed; (iv) historical, real-time, near real-time data characterizing one or more markers that were successfully or unsuccessfully compressed; (v) historical, real-time, near real-time data characterizing a relationship between one or more data compression techniques and one or more segments having marker(s) therein; (vi) historical, real-time, near real-time data characterizing a relationship between one or more data compression techniques and one or more markers; and (vii) any combination thereof.

In one embodiment, the segment identifier 171 generates a decision based, at least in part on the analysis described above. This decision can, for example, include making a determination that the segment having the marker(s) therein, at least one of the marker(s), or any combination thereof is a suitable candidate from data compression. For example, the segment identifier 171 can analyze the segment having the marker(s) therein by applying a heuristic to the segment. In one example, the heuristic includes or is based on historical data that shows likelihoods of successfully compressing previous segments having marker(s) therein that were similar to or different from the segment being analyzed that has marker(s) therein. In another example, the heuristic includes or is based on historical data that shows likelihoods of successfully compressing previous segments having marker(s) therein that were subjected to conditions or environments that were similar to or different from the conditions or environments associated with the segment being analyzed that has marker(s) therein. The segment identifier 171, in one embodiment, determines that the segment having the marker(s) therein is the candidate for compression based, at least in part, on the decision described above.

In one embodiment, and after the segment identifier 171 determines that the segment having the marker(s) therein is a candidate for compression, the segment identifier 171 generates data (e.g., an identifier, a segment, a suitable data structure, any combination thereof, etc.) to indicate that the segment having the marker(s) therein is the candidate for compression. In one embodiment, the segment identifier 171 includes (e.g., adds, inserts, embeds, etc.) the generated data in the segment having the marker(s) therein. In an alternate embodiment, the segment identifier 171 refrains from generated data in the segment having the marker(s) therein. In one embodiment, the segment identifier 171 communicates one or more of the segment having the marker(s) therein and the generated data to a segment compressor 172, which is described in further detail below.

In one embodiment, the one or more logic or modules of the storage manager or storage controller 170 include a segment compressor 172 that can assist with enabling one or more embodiments described herein that are directed to intelligently compressing metadata in a data storage system architecture, such as the architecture 100. For example, and in one embodiment, the segment compressor 172 can enable selective compression of a subset of data from a set of data in a data storage or other similar system according to one or more other embodiments described herein.

The segment compressor 172 can, in one embodiment, receive one or more of the segment having the marker(s) therein and the generated data from the segment identifier 171, as described above. In one embodiment, the segment compressor 172 compresses or is configured to compress the segment comprising the marker(s) therein that was deemed to be a candidate for compression using one or more data compression techniques. For example, the segment compressor 172 may cause or be configured to cause one or more components of the storage system 104 to compress the segment comprising the marker(s) therein that was deemed to be a candidate for compression using one or more data compression techniques. Examples of the one or more components of the storage system 104 include, but are not limited to, at least one component of the storage service engine 106, the storage service engine 106, the deduplication engine/logic 107, and any combination thereof.

In one embodiment, the storage manager or storage controller 170 can control a rate or amount of intelligent compression of metadata as described herein. For example, and in one embodiment, the storage manager or storage controller 170 can determine one or more attributes associated with resource utilization and/or operational efficiency of one or more components of the architecture 100. Based on this determination, the storage manager or storage controller 170 limits or upgrades a rate or amount of intelligent compression of metadata as described herein. In one embodiment, the storage manager or storage controller 170 limits a rate or amount of intelligent compression of metadata as described herein in response to the resource utilization exceeding a threshold resource utilization, the operational efficiency exceeding a threshold operational efficiency, or any combination thereof. In one embodiment, the storage manager or storage controller 170 upgrades a rate or amount of intelligent compression of metadata as described herein in response to the resource utilization being less than or equal to a threshold resource utilization, the operational efficiency being less than or equal to a threshold operational efficiency, or any combination thereof.

In one embodiment, the storage manager or storage controller 170 can control a rate or amount of intelligent compression of metadata, as described herein, that is performed by the resources of the component(s) of the architecture 100. For example, and in one embodiment, the storage manager or storage controller 170 can determine one or more attributes associated with resource utilization and/or operational efficiency of one or more components of the architecture 100. Based on this determination, the storage manager or storage controller 170 causes performance of some or all intelligent compression of metadata, as described herein, to one or more hardware-assisted technologies. For example, the process of compressing metadata can be offloaded to other hardware such as co-processors or data processing accelerators (e.g., FPGA, ASIC, PCIe devices).

In one embodiment, the storage manager or storage controller 170 causes the performance transfer in response to the resource utilization exceeding a threshold resource utilization, the operational efficiency exceeding a threshold operational efficiency, or any combination thereof. In one embodiment, the storage manager or storage controller 170 refrains from causing the performance transfer in response to the resource utilization being less than or equal to a threshold resource utilization, the operational efficiency being less than or equal to a threshold operational efficiency, or any combination thereof.

Embodiments of the storage manager or storage controller 170 described herein, which include the segment identifier 171 and the segment compressor 172, can enable intelligent compression of metadata in a data storage system architecture, such as the architecture 100. This is at least because at least one of the embodiments of the storage manager or storage controller 170 described herein has several advantages that can assist with minimizing or eliminating one or more of the shortcomings described above. For example, at least one embodiment of the storage manager or storage controller 170 can enable the storage system 104 to selectively compress one or more data segments based, at least in part, on a characteristic of at least one of the data segment(s). Exemplary characteristics of a data segment include, but are not limited to, a type of the data or metadata represented by the data segment, a size of the data or metadata represented by the data segment, a compressibility of the data or metadata represented by the data segment, a similarity or dissimilarity of data or metadata represented by the data segment to data or metadata represented by another data segment, and any combination thereof. In this way, the storage manager or storage controller 170 can assist with enabling the storage system 104 to temper its usage of storage and computing resources, which can in turn assist the storage system 104 with optimizing its storage utilization capability and its operational efficiency. At least one of these optimizations can assist with improving resource utilizations and operational efficiencies associated with one or more components, entities, or technologies in or associated with the architecture 100. This and other advantages can assist with improving data storage technologies associated with data storage systems.

Figure 2:
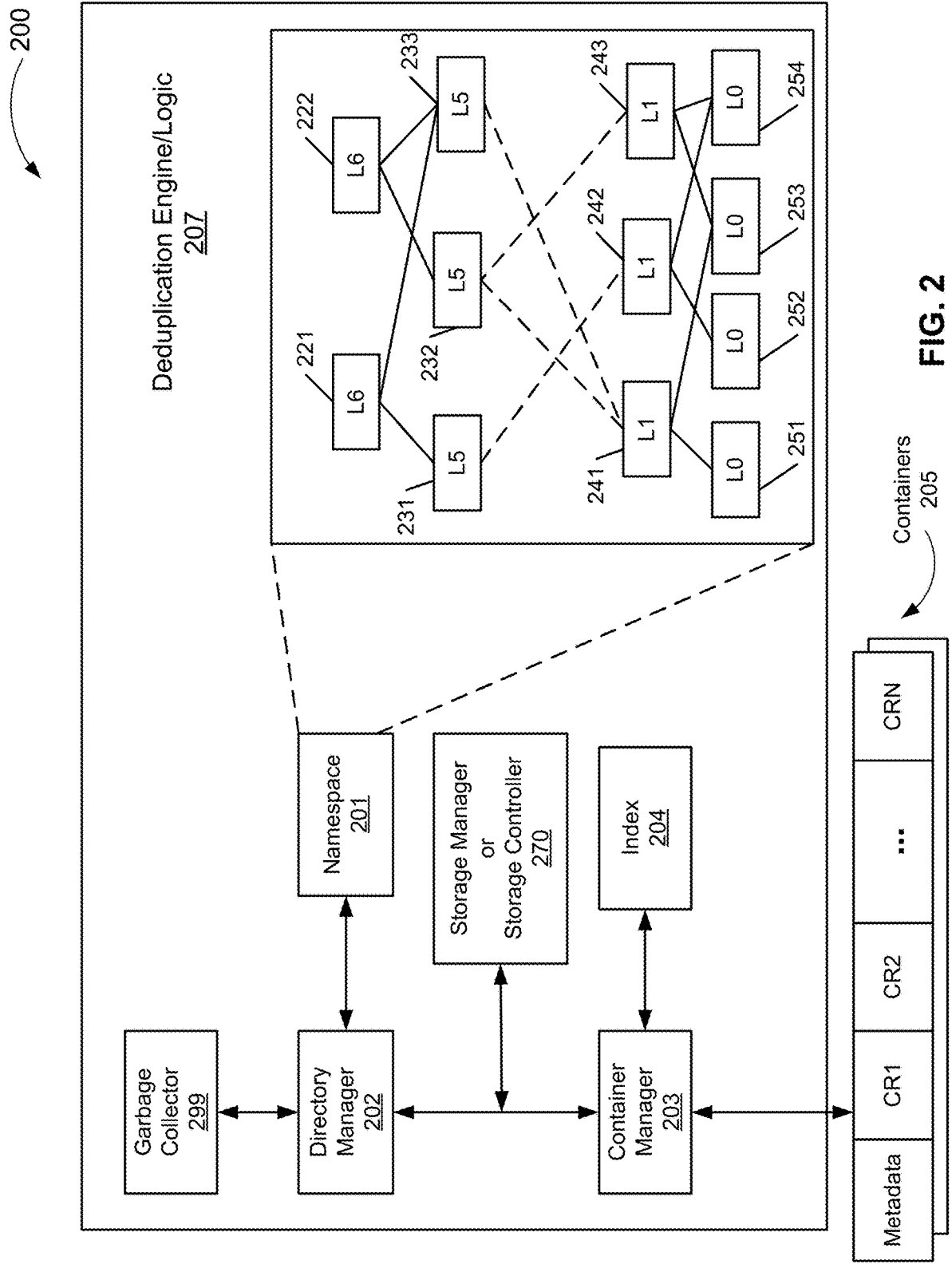
FIG. 2 is a block diagram illustrating a data storage system that includes a deduplication engine/logic and containers according to one or more embodiments described herein.

FIG. 2 is a block diagram illustrating a data storage system 200 that includes a deduplication engine/logic 207 and containers 205 according to one or more embodiments described herein. The deduplication engine/logic 207 shown in FIG. 2 includes a storage manager or storage controller 270, which can be similar or identical to the storage manager or storage controller 170 described above in connection with FIG. 1. The storage system 104 described above in connection with FIG. 1 can be, include, or be based on the data storage system 200 described below in connection with FIG. 2. The deduplication engine 107 described above in connection with FIG. 1 can be, include, or be based on the deduplication engine/logic 207 described below in connection with FIG. 2. One or more of the storage units 108-109 described above in connection with FIG. 1 can include or be based on at least one of the containers 205 described below in connection with FIG. 2. Each of the components in the data storage system 200 can be implemented using hardware, software, or any combination thereof. For example, at least one of the components set forth in FIG. 2 is implemented using processing logic, one or more processing modules, processing circuitry, one or more processors or computers executing machine readable instructions, any other suitable technology for implementing one or more of the components of the data storage system 200, and any combination thereof.

Referring now to the deduplication engine/logic 207 shown in FIG. 2, one or more of a storage manager or storage controller 270 and a garbage collector 299 traverses a namespace 201 via a directory manager 202, where the directory manager 202 manages or is configured to manage one or more files stored in a file system of the data storage system 200. In a deduplicated file system, a file may be represented in a file tree having one or more levels of segments in a multi-level hierarchy. In this example, there are seven levels L0 to L6, where L6 is the root level, also referred to as a top parent level. More or fewer levels may be applied herein. Each upper level contains one or more references to one or more lower level segments. In one embodiment, an upper level segment contains a fingerprint (e.g., metadata) of fingerprints of its child level segments. Only the lowest level segments are the actual data segments containing the actual deduplicated segments. Thus, L1 to L6 are segments that only contain metadata of their respective child segments(s), referred to herein as Lp segments.

In one embodiment, when one or more of the storage manager or storage controller 270 and the garbage collector 299 traverses the namespace 201 via the directory manager 202, a respective one of the storage manager or storage controller 270 and the garbage collector 299 obtains fingerprints of the root level segments, in this example, L6 segments, as part of content handles from the namespace 201. Based on the fingerprints of the current level segments, a container manager 203 can identify the containers 205 in which the segments are stored based on indexing information from an index 204. The index 204 may be maintained in the system memory (e.g., volatile memory) and/or in a storage device (e.g., non-volatile memory). The index 204 includes information mapping a fingerprint to a storage location that stores a segment represented by the fingerprint. In one embodiment, the index 204 may be a fingerprint-to-container identifier (FP/CID) index that maps a particular fingerprint to a container that contains the corresponding segment or a compression region (CR) having the segment stored therein.

The metadata (e.g., fingerprints) and the data section of the current level segments can be obtained from the identified container. A container may contain metadata or fingerprints of all segments stored therein, where segments are compressed into a compression region. A segment can be obtained by retrieving the entire container or the corresponding compression region from the storage device or disk.

Based on the metadata or the data section of a current level segment, its child segment or segments can be identified, and so on. Throughout this application, for the purpose of illustration, a container contains one or more compression regions and each compression region contains one or more segments therein. However, the techniques may also be applied to other storage layouts.

Referring back to FIG. 2, in one embodiment, there are two components responsible for managing the files in the data storage system 200. The first one is the directory manager 202, which is a hierarchical mapping from the path to the inode representing a file. The second one is a content store (not shown), which manages the content of the file. Each file has a content handle (CH) that is stored in the inode that is created by the content store every time the file content changes. Each CH represents a file that is abstracted as a file tree (e.g., a Merkle tree or Mtree) of segments. In this example, a file tree can have up to seven (7) levels: L0, . . . , L6. The L0 segments represent user data (e.g., actual data, user data, body, payload, etc.) and are the leaves of the tree. The L6 is the root of the segment tree. Segments from L1 to L6 are referred to as metadata segments or Lp segments. The Lp segments represent the metadata of the file. An L1 segment is an array of L0 references. Similarly, an L2 is an array of L1 references and so on. A segment is considered live if it can be referenced by any live content in the file system.

The file system packs the segments into containers 205, which are written to a disk in a log-structured manner. At least one of the containers 205 can, for example, be included in one or more of the storage units 108-109 described above in connection with FIG. 1. In a further example, one or more the containers 205 can be used to contain some or all of the metadata 110-111, some or all of the data objects 112-113, or any combination thereof. The log-structured container set has a log tail and a log head. New containers are always appended at the head of the log. Each container is structured into sections. The first section is the metadata section and the following sections are compression regions. A compression region is a set of compressed segments. In the metadata section all the references or fingerprints that identify the segments in the container. The metadata further includes information identifying a content type, which describes the content of the container. For instance, the metadata describes a compression algorithm that has been used, the type or types of segments in the container (L0, . . . , L6), etc. The container manager 203 is responsible for maintaining a log-structured container set and providing a mapping from container identifiers (CIDs) to a block offset on one or more disks. This mapping may be maintained in memory. The container manager 203 also contains additional information, e.g., the content type of each container.

In the example as shown in FIG. 2, a segment 221 includes a fingerprint of fingerprints of segments 231 and 233, and a segment 222 includes a representation (e.g., a fingerprint) of fingerprints of segments 232-233, and so on. Some of the segments, such as the segment 233, are referenced as being shared by multiple parent level segments (e.g., segments 221-222). Thus, the segments 221, 222, 231, 232, 233, 241, 242, and 243 contain data representing the metadata of their respective child segments, while the segments 251, 252, 253, and 254 contain the actual user data.

As alluded to above, at least one currently available data storage system indiscriminately performs or is configured to indiscriminately perform one or more data compression techniques on any and all metadata ingested by the data storage system. For example, and with regard to FIG. 2, a currently available data storage system may be configured to indiscriminately perform one or more data compression techniques on any and all of the L1-L6 segments, including the segments 221-222, 231-233, and 241-243. As explained above, however, the indiscriminate performance of data compression on any and all of the L1-L6 segments can result in inefficient resource and storage utilization by the data storage system, which can in turn result in suboptimal operation of one or more components of the currently available data storage system. These and other shortcomings are described above in more detail.

In contrast, embodiments of a data storage system 200 that include a deduplication engine/logic 207, which itself includes a storage manager or storage controller 270, can intelligently compress or be configured to intelligently compress metadata that is ingested by the data storage system 200. Consequently, one or more embodiments of intelligently compressing metadata ingested by the data storage system 200 can assist with minimizing or eliminating one or more of the shortcomings described above. In one embodiment, the deduplication engine/logic 207 receives or is configured to receive data comprising metadata and the deduplication engine/logic 207 abstracts or is configured to abstract the received data into a file tree of segments, as described above in connection with at least one of FIGS. 1-2. In one embodiment, the storage manager or storage controller 270 receives or is configured to receive data comprising metadata and the storage manager or storage controller 270 abstracts or is configured to abstract the received data into a file tree of segments, as described above in connection with at least one of FIGS. 1-2. For example, and in one embodiment, the storage manager or storage controller 270 causes or is configured to cause one or more components of the deduplication engine/logic 207 to receive the data comprising the metadata and abstract the received into a file tree of segments. In one embodiment, one or more of the segments represents at least some of the received metadata.

In one embodiment, the deduplication engine/logic 207 determines or is configured to determine, from the segments, that one of the segments comprises one or more markers. The segment comprising the marker(s), in one embodiment, represents at least some of the received metadata. In one embodiment, the storage manager or storage controller 270 determines or is configured to determine, from the segments, that one of the segments comprises one or more markers. For example, and in one embodiment, the storage manager or storage controller 270 determines or is configured to determine that one of the segments comprises one or more markers based, at least in part, on data acquired from, generated by, or associated with one or more interactions between: (i) the storage manager and controller 270; and (ii) one or more of the directory manager 202, the namespace 201, the container manager 203, the containers 205, the index 204, and the garbage collector 299.

For one example, the storage manager or storage controller 270 may traverse or be configured to traverse the namespace 201 to determine that one of the segments comprises one or more markers. In this example, the storage manager or storage controller 270 performs the traversal via communication with the directory manager 202.

For another example, the storage manager or storage controller 270 may determine, acquire, or receive one or more data structures that are representative of data, metadata, or any combination thereof that is generated by or associated with some or all of the index 204. In this example, the storage manager or storage controller 270 determines, acquires, or receives the data structure(s) via communication with the container manager 203. Furthermore, and in this example, the storage manager or storage controller 270 processes (e.g., inspects, analyzes, etc.) the data structure(s) to determine that one of the segments comprises one or more markers.

Some or all parts of the preceding examples may be combined in any form or fashion. In at least one embodiment, some or all of the description provided above in connection with FIG. 1 related to determining that one of the segments comprises marker(s) is applicable to one or more embodiments of the deduplication engine/logic 207, the storage manager or storage controller 270, or any combination thereof. For example, the storage manager or storage controller 270 determine that one of the segments comprises marker(s) based, at least in part, on some or all of the description about this determination that provided above in connection with FIG. 1.

In one embodiment, the deduplication engine/logic 207 determines or is configured to determine that the segment comprising the marker(s) is a candidate for data compression. A candidate for data compression can be used sometimes to refer to data, metadata, or any combination thereof that is suitable for data compression. In one embodiment, this determination is based, at least in part, on at least one of the marker(s) in the segment. In one embodiment, the storage manager or storage controller 270 determines or is configured to determine that the segment comprising the marker(s) is a candidate for data compression. For example, and in one embodiment, the storage manager or storage controller 270 determines or is configured to determine that the segment comprising the marker(s) is a suitable candidate for data compression based, at least in part, on data acquired from, generated by, or associated with one or more interactions between: (i) the storage manager and controller 270; and (ii) one or more of the directory manager 202, the namespace 201, the container manager 203, the containers 205, the index 204, and the garbage collector 299.

For one example, the storage manager or storage controller 270 may traverse or be configured to traverse the namespace 201 to determine that the segment comprising the one or more markers is a suitable candidate for compression. In this example, the storage manager or storage controller 270 performs the traversal via communication with the directory manager 202.

For another example, the storage manager or storage controller 270 may determine, acquire, or receive one or more data structures that are representative of data, metadata, or any combination thereof that is generated by or associated with some or all of the index 204. In this example, the storage manager or storage controller 270 determines, acquires, or receives the data structure(s) via communication with the container manager 203. Furthermore, and in this example, the storage manager or storage controller 270 processes (e.g., inspects, analyzes, etc.) the data structure(s) to determine that the segment comprising the one or more markers is a suitable candidate for compression.

Some or all parts of the preceding examples may be combined in any form or fashion. In at least one embodiment, some or all of the description provided above in connection with FIG. 1 that relates to determining that the segment comprising the marker(s) is a suitable candidate for compression is applicable to one or more embodiments of the deduplication engine/logic 207, the storage manager or storage controller 270, or any combination thereof. For example, the storage manager or storage controller 270 may apply a heuristic to some or all of the data acquired from, generated by, or associated with the one or more interactions described above. Examples of such a heuristic are described above in connection with one or more of the components of the data storage system architecture 100 illustrated in FIG. 1.

In one embodiment, the deduplication engine/logic 207 generates or is configured to generate data indicating that the segment comprising the marker(s) is a suitable candidate from compression. For example, and in one embodiment, the storage manager or storage controller 270 may generate or be configured to generate data (e.g., an identifier, a segment, a data structure, any combination thereof, etc.) indicating that the segment comprising the marker(s) is a suitable candidate from compression. Any suitable technique or combination of techniques for generating such data may be used. In one embodiment, the deduplication engine/logic 207 includes the generated data in the segment comprising the marker(s). In one embodiment, the deduplication engine/logic 207 refrains from including the generated data in the segment comprising the marker(s). In one embodiment, the storage manager or storage controller 270 includes the generated data in the segment comprising the marker(s). In one embodiment, the storage manager or storage controller 270 refrains from including the generated data in the segment comprising the marker(s).

In one embodiment, the deduplication engine/logic 207 performs or is configured to perform one or more data compressions techniques on the segment comprising the marker(s) that is identified as a suitable candidate for compression. In one embodiment, the storage manager or storage controller 270 performs or is configured to perform one or more data compressions techniques on the segment comprising the marker(s) that is identified as a suitable candidate for compression. Any suitable data compression technique or combination of data compression techniques may be used by the deduplication engine/logic 207, the storage manager or storage controller 270, or any combination thereof.

Figure 3:
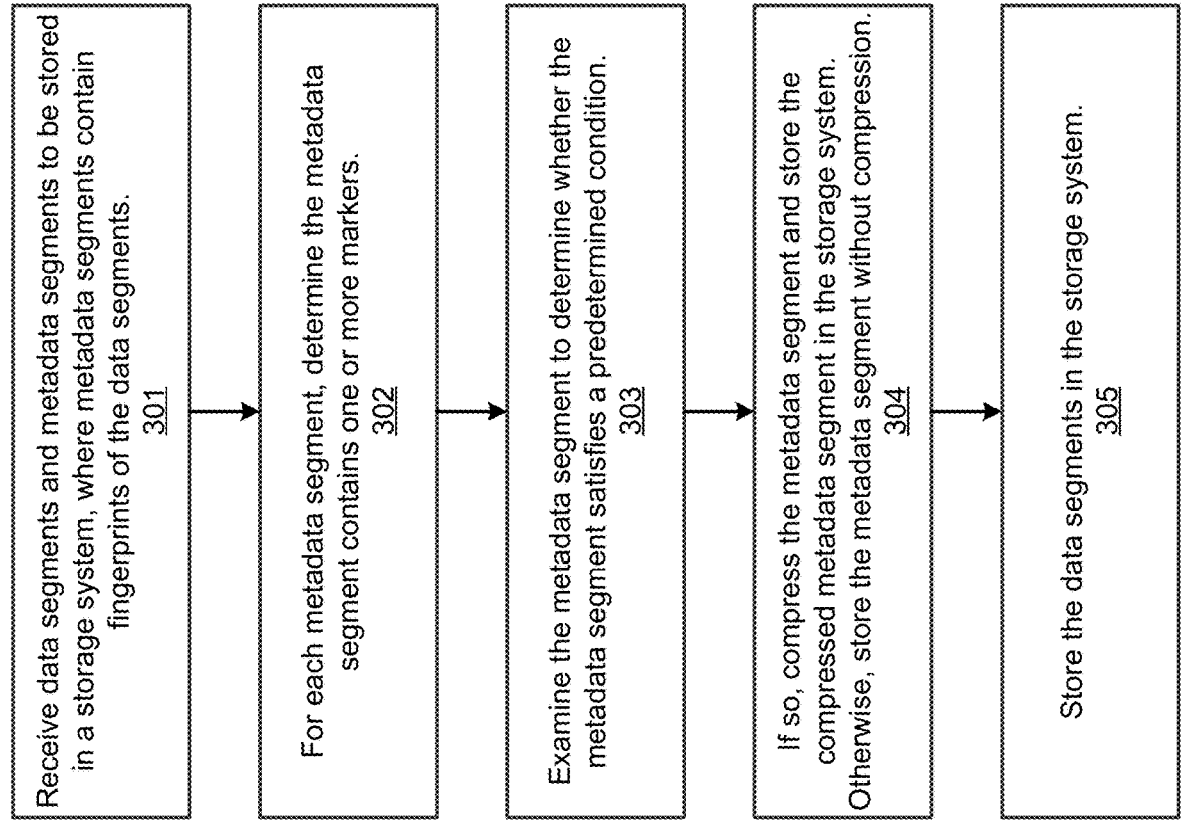
FIG. 3 is a flow diagram illustrating an example of a process for processing markers in metadata according to one embodiment.

FIG. 3 is a flow diagram illustrating an example of a process for processing metadata according to one embodiment. Process 300 may be performed by processing logic which may include software, hardware, or a combination thereof. For example, process 300 may be performed by serve 104 of FIG. 1. Referring to FIG. 3, at block 301, processing logic receives a set of data segments and metadata segments associated with the data segments. The metadata segments include fingerprints of the data segments. The data segments and metadata segments may be received from a client at real-time, for example, for backup purpose. Alternatively, the data segments and metadata segments may be identified by a garbage collection process from existing data stored in the storage system for optimization purposes. For each of the metadata segments, at block 302, processing logic determines whether the metadata segment includes one or more markers. The markers may be inserted by a client into the backup stream received at the storage system. If the metadata segment contains at least one marker, at block 303, processing logic examines the metadata segment to determine whether the metadata segment satisfies a predetermined condition. If the metadata segment satisfies the predetermined condition, at block 304, processing logic compresses the metadata segment and stores the compressed metadata segment in the storage system, otherwise, the metadata segment is stored without compression. At block 305, the data segments are then stored in the storage system.

Figure 4:
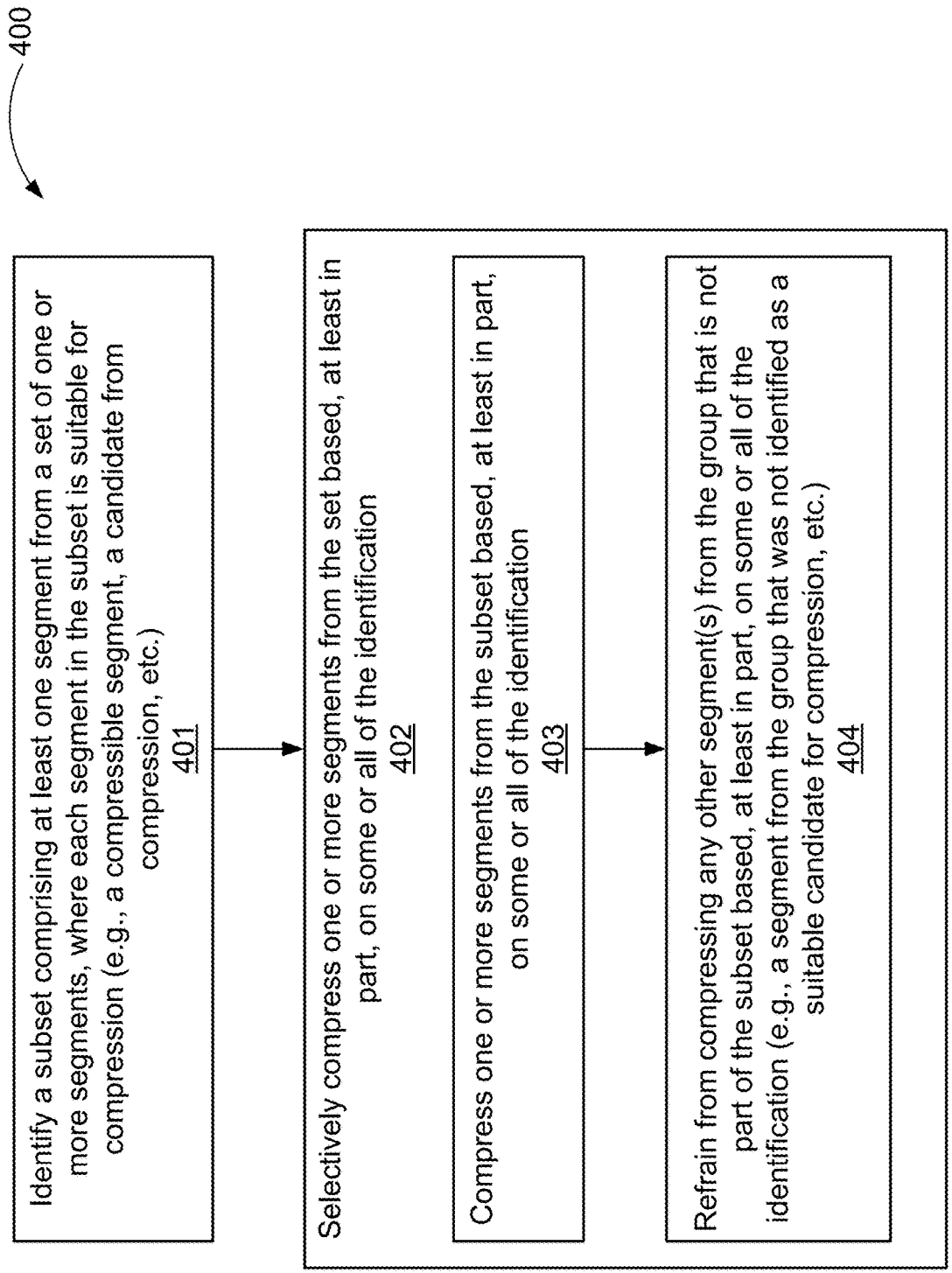
FIG. 4 is a flow diagram illustrating a process of intelligently compressing metadata in a data storage or other similar system according to one or more additional embodiments described herein.

FIG. 4 is a flow diagram illustrating a process 400 of intelligently compressing metadata in a data storage or other similar system according to one or more embodiments described herein. Process 400 may be performed by processing logic which may include software, hardware, or a combination thereof.

The processing logic performing the process 400 begins at a block 401. Here, the processing logic identifies or is configured to identify a subset comprising at least one segment from a set of one or more segments. In one embodiment, each segment in the subset is suitable for compression (e.g., a compressible segment, a candidate form compression, etc.). At least one segment from the subset can, for example, represent or include marker data. In one embodiment, the processing logic implements the block 401 based, at least in part, on one or more segmentation criteria, policies, rules, heuristics, or any combination thereof. The one or more segmentation criteria, policies, rules, heuristics, or any combination thereof can, in one embodiment, be determined or implemented based on some or all of the description provided in connection with at least one of FIGS. 1-3.

After the block 401, the processing logic performing the process 400 proceeds to a block 402. Here, the processing logic selectively compresses or is configured to selectively compress one or more segments from the set. In one embodiment, the processing logic performs the selective compression based, at least in part, on some or all of the identification performed in block 401. For example, and in one embodiment, the processing logic performs the selective compression by performing two blocks—block 403 and block 404. In one embodiment, the processing logic performs the block 403. For example, the processing logic compresses or is configured to compress one or more of the segments in the subset based, at least in part, on at least some of the identification. In an example, the processing logic performs the block 403 by compressing each segment in the subset based, at least in part, on at least some of the identification. In one embodiment, the processing logic performs the block 404. For example, the processing logic refrains or is configured to refrain from compressing one or more of the segments in the set that are not part of the subset. Refraining from compression is based, at least in part, on at least some of the identification. In a specific example, the processing logic performs the block 404 by refraining from compressing each segment that is not part of the subset based, at least in part, on at least some of the identification.

Figure 5:
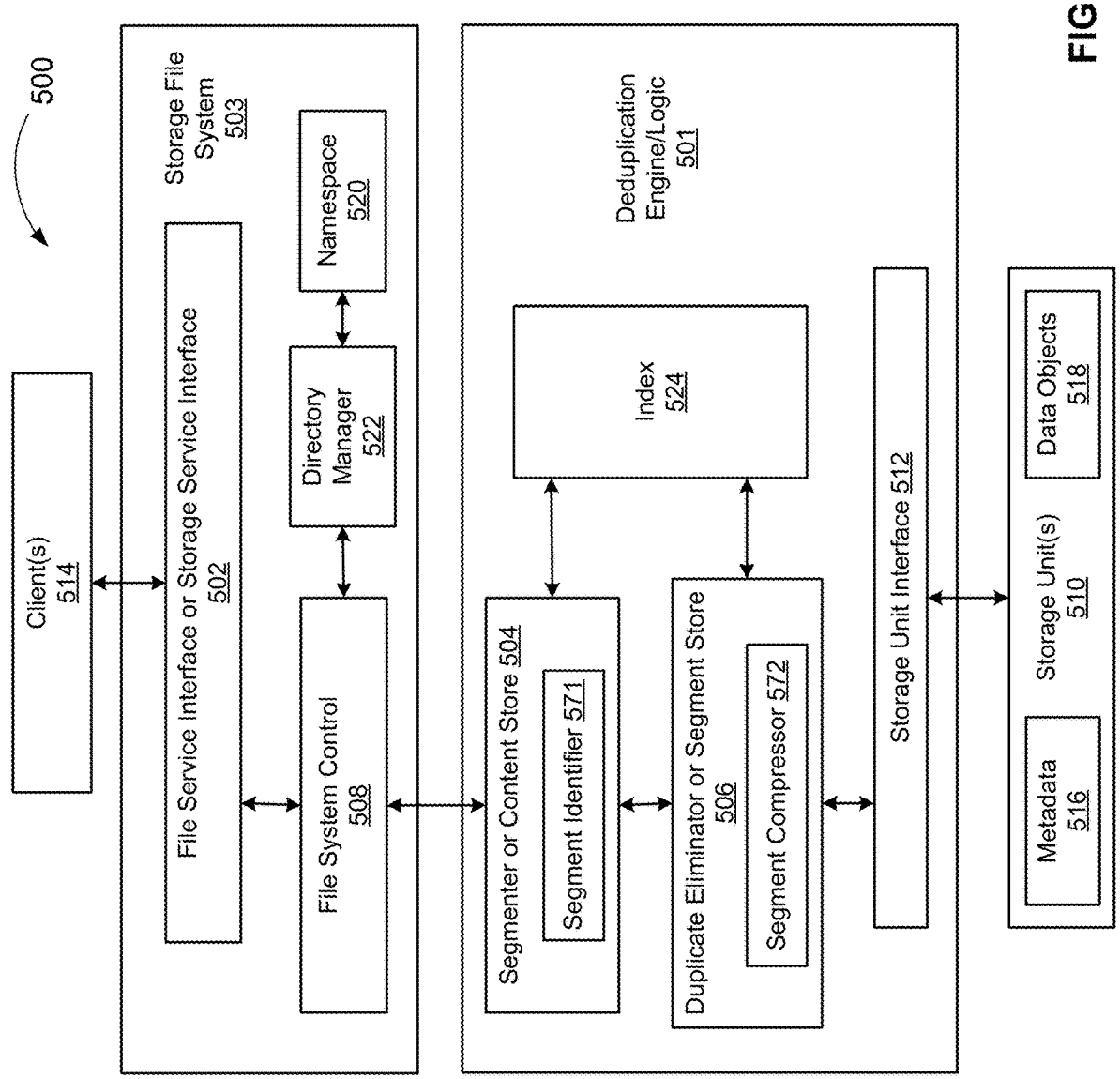
FIG. 5 is a block diagram illustrating a deduplication storage system according to one or more embodiments described herein.
Figure 6:
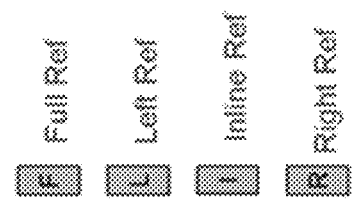
FIG. 6 shows an example of metadata of a deduplicated storage system.
Figure 6:
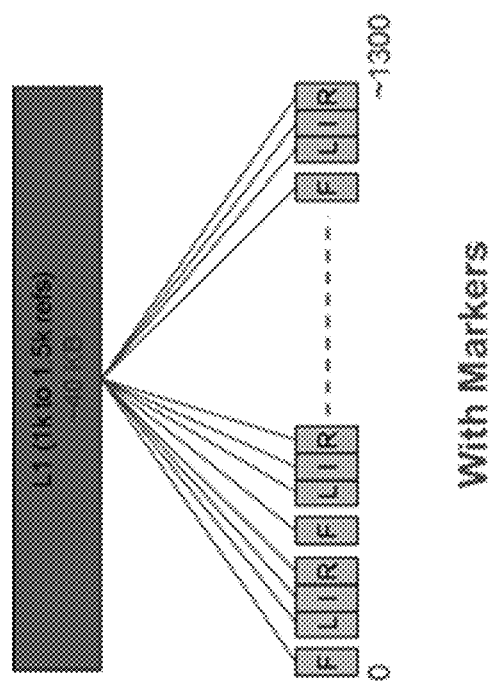
Figure 6:
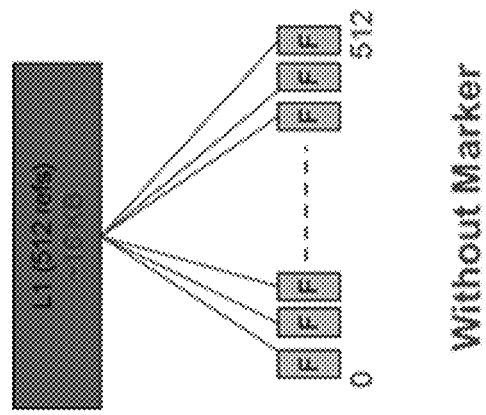

FIG. 5 is a block diagram illustrating a deduplication storage system 500 according to one or more embodiments described herein. For example, the deduplication storage system 500 may be implemented as part of a deduplication storage system as described above, such as, for example, the deduplication storage system as a client and/or a server described above in connection with one or more of FIGS. 1-4. In one embodiment, the storage system 500 may represent a file server (e.g., an appliance used to provide network attached storage (NAS) capability), a block-based storage server (e.g., used to provide storage area network (SAN) capability), a unified storage device (e.g., one which combines NAS and SAN capabilities), a near-line storage device, a direct attached storage (DAS) device, a tape backup device, or essentially any other type of data storage device. The storage system 500 may have a distributed architecture, or all of its components may be integrated into a single unit. The storage system 500 may be implemented as part of an archive and/or backup system, or a disaster recovery system, such as a deduplicating storage system available from EMC® Corporation of Hopkinton, Mass.

In one embodiment, the storage system 500 includes a deduplication engine/logic 501 interfacing one or more clients 514, via file system 503, with one or more storage units 510 storing metadata 516 and data objects 518. The client(s) 514 may be based on or include any kinds of client, such as, for example, a client application, backup software, a garbage collector, or a storage management function, located locally or remotely over a network.

One or more of the storage devices or units 510 may be implemented locally (e.g., single node operating environment) or remotely (e.g., multi-node operating environment) via an interconnect, which may be a bus and/or a network (e.g., a storage network). In one embodiment, at least one of the storage units 510 operates as an active storage to receive and store external or fresh user data from a client (e.g., an end-user client or a primary storage system associated with one or more end-user clients), while the another one of storage units 510 operates as a target storage unit to periodically archive data from the active storage unit according to an archiving policy or scheme.

The metadata, such as some or all of the metadata 516, may be stored in at least one of the storage units 510, such that files can be accessed independent of another storage unit. Some or all of the metadata of each storage unit includes enough information to provide access to the files it contains. In one embodiment, some or all of the metadata may include fingerprints or representatives contained within at least one of the data objects 518, where a data object may represent a data segment (also referred to as a data chunk), a compression region (CR) of one or more data segments, or a container of one or more CRs. Fingerprints are mapped to a particular data object via at least some of the metadata 516, enabling the system 500 to identify the location of the data object containing a data segment represented by a particular fingerprint. A fingerprint may be generated based on at least a portion of a data segment, for example, by applying a predetermined mathematical algorithm (e.g., hash function) to at least a portion of the content of the data segment. When an active storage unit fails, metadata contained in another storage unit may be utilized to recover the active storage unit. When one storage unit is unavailable (e.g., the storage unit has failed, or is being upgraded, etc.), the system remains up to provide access to any file not stored in the failed storage unit. When a file is deleted, the metadata associated with the files in the system is updated to reflect that the file has been deleted.

In one embodiment, at least some of the metadata 516 may include a file name, a storage unit identifier (ID) identifying a storage unit in which the segments associated with the file name are stored, reconstruction information for the file using the segments, and any other appropriate metadata information. Some or all of the metadata 516 may further include a segment ID, a segment sketch, a hash of a segment, an encrypted hash of a segment, random data, or any other appropriate metadata. In some embodiments, metadata associated with a segment is used to identify identical and/or similar data segments. The stored metadata enables a faster identification of identical and/or similar data segments as an ID and/or sketch (e.g., a set of values characterizing the segment) do not need to be recomputed for the evaluation of a given incoming data segment.

In one embodiment, the file system 503 includes a file service interface or storage service interface 502, a file system control 508, a directory manager 522, and a file system namespace 520. The deduplication engine/logic 501 includes a segmenter 504 (also referred to as a segmenting module or unit), a duplicate eliminator 506, and a storage unit interface 512. The file system control 508 receives a file or files (or data item(s)) via the file service interface or storage service interface 502, which may be part of a file system namespace 520 of the file system 503 associated with the deduplication engine/logic 501. The file system namespace 520 refers to the way files are identified and organized in the system. An example is to organize the files hierarchically into directories or folders, which may be managed by the directory manager 522. The file service interface or storage service interface 502 supports a variety of protocols, including a network file system (NFS), a common Internet file system (CIFS), a direct access file system (DAFS), Hadoop distributed file system (HDFS), and a virtual tape library interface (VTL), etc.

The file(s) is/are processed by the segmenter 504 and the file system control 508. The segmenter 504, also referred to as a content store 504, breaks the file(s) into variable-length segments based on a variety of rules or considerations. For example, the file(s) may be broken into segments by identifying segment boundaries. Segment boundaries may be determined using file boundaries, directory boundaries, byte counts, content-based boundaries (e.g., when a hash of data in a window is equal to a value), or any other appropriate method of determining a boundary. Reconstruction of a data block, data stream, file, or directory includes using one or more references to the one or more segments that originally made up a data block, data stream, file, or directory that was/were previously stored.

Referring again to FIG. 5, the segmenter or content store 504 may include a processing logic that implements a segment identifier 571. In one embodiment, the segment identifier 571 can be similar or identical to one or more of the segment identifiers described above in connection with one or more of FIGS. 1-4. For example, and in one embodiment, the segment identifier 571 can include or be based on the segment identifier 171 that is described above in connection with FIG. 1.

In one embodiment, the file system control 508, also sometimes referred to as a file system manager, processes information to indicate the segment(s) association with a file. In some embodiments, a list of fingerprints is used to indicate segment(s) associated with a file. The file system control 508 passes segment association information (e.g., representative data such as a fingerprint) to an index 524. The index 524 is used to locate stored segments in one or more of the storage units 510 via a storage unit interface 512. In one embodiment, the index 524 may include multiple entries, each entry corresponding one of the deduplicated segments. Each entry maps a representative or fingerprint of a deduplicated segment to a storage location identifier identifying a storage location storing the corresponding deduplicated segment. In one embodiment, each entry of the index 524 maps a fingerprint of a segment to a container identifier identifying a container that contains the corresponding segment.

In one embodiment, the index 524 includes a persistent hash-table of segment-IDs keyed either by the digest of the data stored in the segment or by the deduplication key of the data stored in the segment. The index 524 need not contain entries for every data segment in the deduplication domain, but the effectiveness of deduplication is a function of the number of entries stored in the index 524. Deduplication of data happens in two logically distinct operations: detection and remapping. The detection operation identifies blocks containing the same data. The remapping operation updates address maps that record physical locations of logical units of data so that a single block of data is shared by multiple logical units (LUNs) or by multiple positions within the same LUN. Detection is accomplished by building a database (e.g., the index 524, etc.) that maintains a digest (e.g., SHA, checksum, etc.) and a deduplication key for each data block. When two data blocks have the same digest they have a sufficiently high probability of containing the same data to warrant a bit-for-bit comparison to confirm they are exact duplicates. Remapping leverages dynamic block-mapping technology of a file system mapping driver. A file system allows dynamic manipulation of the address maps that connects LUN's logical address space to its physical address space.

A duplicate eliminator 506, also referred to as a segment store 506, identifies whether a newly received segment has already been stored in one or more of the storage units 1410. In the event that a segment has already been stored in storage unit(s), a reference to the previously stored segment is stored, for example, in a segment tree associated with the file, instead of storing the newly received segment. A segment tree of a file may include one or more nodes and each node represents or references one of the deduplicated segments stored in at least one of the storage units 510 that make up the file. Segments are then packed by a container manager (which may be implemented as part of the storage unit interface 512) into one or more storage containers stored in at least one of the storage units 510. The deduplicated segments may be further compressed into one or more CRs using a variation of compression algorithms, such as a Lempel-Ziv algorithm before being stored. A container may contain one or more CRs and each CR may contain one or more deduplicated segments (also referred to deduplicated segments). A container may further contain the metadata such as fingerprints, sketches, type of the data segments, etc. that are associated with the data segments stored therein.

With regard again to FIG. 5, the duplicate eliminator or segment store 506 can include a processing logic that implements a segment compressor 572. In one embodiment, the segment compressor 572 can be similar or identical to one or more of the segment compressors described above in connection with one or more of FIGS. 1-4. For example, and in one embodiment, the segment compressor 572 can include or be based on the segment compressor 172 that is described above in connection with FIG. 1.

When a file is to be retrieved, the file service interface or storage service interface 502 is configured to communicate with file system control 508 to identify appropriate segments stored in at least one of the storage units 510 via the storage unit interface 512. The storage unit interface 512 may be implemented as part of a container manager. The file system control 508 communicates (e.g., via the segmenter 504) with the index 524 to locate appropriate segments stored in storage units via the storage unit interface 512. Appropriate segments are retrieved from the associated containers via the container manager and are used to construct the requested file. The file is provided via the file service interface or storage service interface 502 in response to the request. In one embodiment, the file system control 508 utilizes a tree (e.g., a segment tree obtained from namespace 1420) of content-based identifiers (e.g., fingerprints) to associate a file with data segments and their locations in storage unit(s). In the event that a segment associated with a given file or file changes, the content-based identifiers will change and the changes will ripple from the bottom to the top of the tree associated with the file efficiently since the appropriate content-based identifiers are easily identified using the tree structure.

Note that some or all of the components as shown and described above (e.g., the deduplication engine/logic 501) may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into a dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

At least one of the embodiments set forth herein are not described with reference to any particular programming language. It will be appreciated that a variety of programming languages may be used to implement the teachings of at least one of the embodiments described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

It is to be appreciated that the use of "A or B," "A and B," "A and/or B," "at least one of A or B," "at least one of A and B," "at least one of A and/or B," "one or more of A or B," "one or more of A and B," "one or more of A and/or B," and their variations refer to A alone, B alone, or A and B together.

What is claimed is:

1. A computer-implemented method, comprising:
   receiving a plurality of data segments and a plurality of metadata segments associated with the data segments to be stored in a storage system, wherein the data segments are deduplicated segments and each of the metadata segments includes a fingerprint for the corresponding data segment;
   for each of the metadata segments,
      determining that a metadata segment contains one or more markers inserted by a client device of the storage system,
      examining the metadata segment to determine whether the metadata segment satisfies a predetermined condition including a presence of an inline marker suitable for compression, wherein each inline marker has a size equal to or less than two hundred bytes,
      in response to determining that the metadata segment satisfies the predetermined condition,
         compressing the metadata segment using a predetermined compression algorithm, and
         storing the compressed metadata segment in the storage system, and
      otherwise storing the metadata segment in the storage system without compression; and
   storing the data segments in the storage system.

2. The method of claim 1, wherein the metadata segment satisfies the predetermined condition if a size of the metadata segment exceeds a predetermined size threshold.

3. The method of claim 1, wherein the metadata segment satisfies the predetermined condition if a system parameter of the storage system has been set to a predetermined configuration state.

4. The method of claim 1, wherein the metadata segment satisfies the predetermined condition if a number of markers contained in the metadata segment exceeds a predetermined marker threshold.

5. The method of claim 4, wherein the metadata segment satisfies the predetermined condition if a compression ratio for a metadata segment having a similar number of markers is above a predetermined compression threshold based on a histogram of prior metadata segment compressions.

6. The method of claim 1, wherein the metadata segment satisfies the predetermined condition if heuristics of prior compression of metadata indicates that a prior compression ratio is above a predetermined compression threshold.

7. The method of claim 1, wherein the metadata segment satisfies the predetermined condition if available processing resources of the storage system for data compression are above a predetermined resource threshold.

8. The method of claim 1, wherein the metadata segment satisfies the predetermined condition if an available storage space of the storage system is above predetermined storage threshold.

9. The method of claim 1, wherein the data segments and the metadata segments are received from the client device as a part of a backup operation from the client device to the storage system.

10. The method of claim 1, wherein the data segments and the metadata segments are identified by a garbage collection process periodically performed on existing data segments and metadata segments previously stored in the storage system.

11. A non-transitory machine-readable medium having instructions stored therein, which when executed by a processor, cause the processor to perform operations, the operations comprising:
receiving a plurality of data segments and a plurality of metadata segments associated with the data segments to be stored in a storage system, wherein the data segments are deduplicated segments and each of the metadata segments includes a fingerprint for the corresponding data segment;
for each of the metadata segments,
determining that a metadata segment contains one or markers inserted by a client device of the storage system,
examining the metadata segment to determine whether the metadata segment satisfies a predetermined condition including a presence of an inline marker suitable for compression, wherein the inline marker has a size equal to or less than two hundred bytes,
in response to determining that the metadata segment satisfies the predetermined condition,
compressing the metadata segment using a predetermined compression algorithm, and
storing the compressed metadata segment in the storage system, and
otherwise storing the metadata segment in the storage system without compression; and
storing the data segments in the storage system.

12. The machine-readable medium of claim 11, wherein the metadata segment satisfies the predetermined condition if a size of the metadata segment exceeds a predetermined size threshold.

13. The machine-readable medium of claim 11, wherein the metadata segment satisfies the predetermined condition if a system parameter of the storage system has been set to a predetermined configuration state.

14. The machine-readable medium of claim 11, wherein the metadata segment satisfies the predetermined condition if a number of markers contained in the metadata segment exceeds a predetermined marker threshold.

15. The machine-readable medium of claim 14, wherein the metadata segment satisfies the predetermined condition if a compression ratio for a metadata segment having a similar number of markers is above a predetermined compression threshold based on a histogram of prior metadata segment compressions.

16. The machine-readable medium of claim 11, wherein the metadata segment satisfies the predetermined condition if heuristics of prior compression of metadata indicates that a prior compression ratio is above a predetermined compression threshold.

17. The machine-readable medium of claim 11, wherein the metadata segment satisfies the predetermined condition if available processing resources of the storage system for data compression are above a predetermined resource threshold.

18. The machine-readable medium of claim 11, wherein the metadata segment satisfies the predetermined condition if an available storage space of the storage system is above predetermined storage threshold.

19. The machine-readable medium of claim 11, wherein the data segments and the metadata segments are received from the client device as a part of a backup operation from the client device to the storage system.

20. A data processing system, comprising:
a processor; and
a memory coupled to the processor and storing instructions, which when executed by the processor, cause the processor to perform operations, the operations comprising:
receiving a plurality of data segments and a plurality of metadata segments associated with the data segments to be stored in a storage system, wherein the data segments are deduplicated segments and each of the metadata segments includes a fingerprint for the corresponding data segment;
for each of the metadata segments,
determining that a metadata segment contains one or markers inserted by a client device of the storage system,
examining the metadata segment to determine whether the metadata segment satisfies a predetermined condition,
in response to determining that the metadata segment satisfies the predetermined condition including a presence of an inline marker suitable for compression, wherein the inline marker has a size equal to or less than two hundred bytes,
compressing the metadata segment using a predetermined compression algorithm, and
storing the compressed metadata segment in the storage system, and
otherwise storing the metadata segment in the storage system without compression; and
storing the data segments in the storage system.

* * * * *